US006800142B1

(12) United States Patent
Tipton et al.

(10) Patent No.: US 6,800,142 B1
(45) Date of Patent: Oct. 5, 2004

(54) METHOD FOR REMOVING PHOTORESIST AND POST-ETCH RESIDUE USING ACTIVATED PEROXIDE FOLLOWED BY SUPERCRITICAL FLUID TREATMENT

(75) Inventors: Adrianne Kay Tipton, Fremont, CA (US); Krishnan Shrinivasan, San Jose, CA (US); Souvik Banerjee, Fremont, CA (US); Raashina Humayun, Fremont, CA (US); Patrick Christopher Joyce, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 56 days.

(21) Appl. No.: 10/159,951

(22) Filed: May 30, 2002

(51) Int. Cl.[7] .................................................. B08B 3/00
(52) U.S. Cl. ............................. 134/26; 134/1; 134/1.3; 134/2; 134/28; 134/29; 134/30; 134/19; 134/34; 438/906
(58) Field of Search ..................... 134/1, 1.3, 2, 26, 134/28, 29, 30, 19, 25.4, 34, 35, 36, 41, 902; 438/906; 510/175

(56) References Cited

U.S. PATENT DOCUMENTS 5,269,850 A * 12/1993 Jackson ........................ 134/2
6,149,828 A * 11/2000 Vaartstra ..................... 216/57
6,242,165 B1 * 6/2001 Vaartstra .................... 430/329
6,306,564 B1 * 10/2001 Mullee ....................... 430/329
2001/0008800 A1 * 7/2001 Koch .......................... 438/690
2002/0164873 A1 * 11/2002 Masuda et al. ............. 438/689

FOREIGN PATENT DOCUMENTS

JP          64-45131      * 2/1989
WO         WO01/33613       5/2002

* cited by examiner

Primary Examiner—M. Kornakov
(74) Attorney, Agent, or Firm—Beyer, Weaver & Thomas, LLP

(57) ABSTRACT

Methods for cleaning semiconductor wafers are presented. Contaminants, particularly photoresist and post-etch residue, are removed from semiconductor wafers. A wafer or wafers is first treated with a peroxide-containing medium, for example, to oxidatively cleave bond structures of contaminants on the wafer work surface. Excitation energy is used to activate the peroxide-containing medium toward the formation of radical species. After treatment with the peroxide-containing medium, a supercritical fluid treatment is used to remove any remaining contaminants as well as to condition the wafer for subsequent processing.

46 Claims, 3 Drawing Sheets

METHOD FOR REMOVING PHOTORESIST AND POST-ETCH RESIDUE USING ACTIVATED PEROXIDE FOLLOWED BY SUPERCRITICAL FLUID TREATMENT

FIELD OF THE INVENTION

This invention relates to methods for cleaning semiconductor wafers. More specifically, the invention relates to methods for removing photoresist and post-etch residue from semiconductor wafers. Even more specifically, the invention relates to wafer cleaning methods that utilize supercritical fluid processing.

BACKGROUND OF THE INVENTION

Wafer cleaning in modern VSLI semiconductor processing presents numerous engineering dilemmas. One important issue involves removal of contamination before, during, and after fabrication steps. For example, photoresist strip and residue removal are critical processes in integrated circuit (IC) fabrication. During dielectric etching in a typical integrated circuit fabrication process, undesirable etch residues and/or polymers such as hydrocarbon, fluorocarbon, and/or polymeric residues (e.g. $C_xH_xF_xO_x$) are formed and left on the surfaces and sidewalls of the resulting structures. Such undesirable residues along with the remaining post-etch photoresist must be removed to prevent quality issues in subsequent deposition process such as, adhesion problems, and/or diffusion contamination One common method to remove such residues is plasma stripping, however plasma stripping is often damaging to advanced low-k materials. Consequently, non-plasma methods for removing photoresist, residue, and other contaminants from semiconductor substrates are needed.

Conventional non-plasma methods for removal of, for example, post-etch photoresist and polymer residue (especially over low-k dielectrics) present numerous challenges. Traditional wet chemical cleaning methods use solvents such as NMP, along with amines (e.g., hydroxylamine) to strip resist and remove sidewall residue. However such wet solvent processes require a deionized (DI) water rinse to remove traces of solvent from the features that have been etched into the dielectric. As feature sizes are reduced, and their aspect ratio increases, penetration of DI water and liquid solvents into these features becomes more difficult due to surface tension issues. Also, if liquids do penetrate into such small features, then it becomes increasingly difficult to subsequently remove. Consequently, wet processes have limitations in cleaning residue from the bottom of high-aspect ratio features with small lateral dimensions. Additionally, these wet cleaning methods can over etch exposed layers. This can cause device reliability problems or lead to nonfunctional circuits. And although the oxidative chemistry component of some traditional wet clean methods (e.g. dilute HF (50:1–1000:1 HF:$H_2O$) or "hot Piranha" (90% $H_2SO_4$/10% $H_2O_2$)) can be effective at cleaving the bonding structures of contaminant residues, often the formulations and or cleaning conditions do not provide efficient physical removal of the contaminants. These methods also have the disadvantage of requiring handling and exposure to corrosive and flammable media, thus requiring extensive abatement and environmental controls.

Also there are a number of emerging methods for cleaning wafers. Amongst these new methods, high-pressure processes that employ local densification of a process fluid on the substrate hold promise. Densified fluids are good solvents for contaminants and residues resulting from semiconductor fabrication. Some of these processes, especially those conducted at supercritical pressures, employ additives to increase the solvating power of the process fluid itself. Other additives are used to remove specific contaminants such as polymers, organics, metals, and the like. Although supercritical fluids hold promise for wafer processing, more can be done to exploit their valuable physical properties.

What is therefore needed are improved methods for removing contaminants from wafers, for example photoresist and post-etch residues, preferably methods that not only effectively clean wafers, but also condition them for subsequent processing.

SUMMARY OF THE INVENTION

Methods for cleaning semiconductor wafers are presented. Contaminants, particularly photoresist and post-etch residue, are removed from semiconductor wafers. A wafer or wafers is first treated with a peroxide-containing media, for example, to oxidatively cleave bond structures of contaminants on the wafer work surface. Excitation energy is used to activate the peroxide-containing medium toward the formation of radical species. After treatment with the peroxide-containing medium, a supercritical fluid treatment is used to remove any remaining contaminants as well as condition the wafer for subsequent processing.

One aspect of the invention is a method of cleaning a wafer work surface. Such methods may be characterized by the following operations: applying a peroxide-containing medium to the wafer work surface; applying an excitation energy to the peroxide-containing medium while the peroxide-containing medium is in contact with the wafer work surface, the excitation energy sufficient to generate corresponding hydroxy and peroxy radicals from interaction with the peroxide-containing medium; and then applying a supercritical fluid to the wafer work surface.

Preferably the peroxide-containing medium includes at least one of an aqueous solution, an organic solution, and a solution containing both water and an organic solvent. Preferably the organic solvent includes at least one of an ether, an alcohol, an alkyl halide, a ketone, a nitrile, an aliphatic solvent, an aromatic solvent, an amide, an ester, an acid, an amine, and a fluorinated alkane. Most preferred organic solvents include but are not limited to acetonitrile, ethanol, methanol, isopropanol, tetrahydrofuran, methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, dimethyl ethanolamine, and, hexafluoroethane.

Also preferably the peroxide-containing medium includes between about 10% and 70% by weight of a peroxide source, more preferably between about 30% and 50% by weight of a peroxide source. In preferred embodiments, the peroxide source includes at least one of an inorganic peroxide and an organic peroxide. Inorganic peroxides preferably include at least one of hydrogen peroxide and peroxide adducts such as urea hydroperoxides, ammonium persulfate, and sodium percarbonate. Organic peroxides of the invention include at least one of a monoalkyl peroxide, a dialkyl peroxide, a monoacyl peroxide, and a diacyl peroxide. Specific examples of such organic peroxides include at least one of tertiary butyl hydrogen peroxide, meta-chloroperbenzoic acid, benzoyl peroxide, di-tertiary butyl peroxide, dicumyl peroxide, acetyl peroxide, benzyl peroxide, and butanone peroxide.

The peroxide-containing medium preferably further includes a radical initiator and/or ozone. Preferably the radical initiator includes at least one of 2,2'-azo-bis-isobutyrlnitrile, dicumyl peroxide, benzoyl peroxide, and the like The pH of the peroxide-containing medium is important If basic, preferably the pH of the peroxide-containing medium is between about 9 and 12. If acidic, preferably the pH of the peroxide-containing medium is between about 1 and 6.

Preferably applying an excitation energy to the peroxide-containing medium while the peroxide-containing medium is in contact with the wafer work surface includes application of at least one of a heat source, an irradiation source, and a mechanical agitation source to at least one of the wafer and the peroxide-containing medium.

Irradiation sources of the invention preferably include at least one of a UV lamp, a mercury arc lamp, an eximer laser, a xenon flash lamp, and a high intensity discharge lamp. In one preferred embodiment, applying the excitation energy includes exposing the peroxide-containing medium to ultraviolet irradiation with a wavelength of between about 10 nm and 500 nm, more preferably between about 150 nm and 200 nm.

Heat sources of the invention preferably include at least one of a wafer stage heater, an infrared heater lamp source, a process vessel with heated interior surfaces, and a recirculating heater or heat exchange coils immersed in the processing fluid. In such embodiments, preferably applying the excitation energy includes heating the peroxide-containing medium to between about 40° C. and 150° C.

Preferably the mechanical agitation sources of the invention include at least one of a transducer element (capable of generating mechanical vibration) and a probe member to transmit (either directly or indirectly) said mechanical vibration to the wafer. Mechanical agitation sources may also include a rotation mechanism, an orbit mechanism, and the like.

For the transducer elements of the invention, preferably the source of such vibration may operate in either the ultrasonic or megasonic spectrum. The ultrasonic spectrum would be characterized by frequencies in the range between 10 kHz and 40 kHz, while the megasonic spectrum would consist of frequencies in the range between 100 kHz and 1 MHz.

Preferably the mechanical agitation includes motion sufficient to remove spent reagent from the wafer surface. Such motion may also serve to position the wafer such that the entire work surface area is under the influence of the excitation energy sources. An example of such motion is rotation or orbiting about an axis perpendicular to the work surface of the wafer. Orbiting motion contains both a rotational and a translational element. Preferred speeds of rotation (whether orbiting or not) during exposure to either the peroxide-containing medium or the supercritical fluid preferably are between about 2 rpm and 200 rpm, more preferably between about 10 rpm and 50 rpm. During any subsequent drying processes, for example to remove liquid reagent from the wafer surface after all resist has been stripped, preferably the rotation speeds are between about 100 rpm and 5000 rpm, more preferably between about 1000 rpm and 3000 rpm.

One skilled in the art would understand that any individual excitation energy application may include any or all of the above mentioned energy sources. Particularly preferred embodiments are described in more detail below.

Preferably applying the peroxide-containing medium to the wafer work surface and applying the excitation energy to the peroxide-containing medium while the peroxide-containing medium is in contact with the wafer work surface are conducted over a period of not more than about 60 minutes, more preferably not more than about 10 minutes, most preferably not more than about 2 minutes.

Methods of the invention can further include rinsing the wafer work surface with a solvent before applying the supercritical fluid to the wafer work surface. Deionized water is a particularly preferred solvent for this purpose, although other solvents, for example organic solvents as listed above or mixtures thereof, can be used for rinsing the wafer.

Preferably applying the supercritical fluid to the wafer work surface is performed at a pressure of between about 1200 and 5000 psi, and at a temperature of between about 20° C. and 150° C. Preferred supercritical fluids of the invention include at least one of carbon dioxide, ammonia, water, ethane, propane, butane, dimethyl ether, hexafluoroethane, dimethyl ether, $SF_6$, ethylene, $N_2O$, Xe, and mixtures thereof.

In particularly preferred embodiments, the supercritical fluid also contains between about 0 and 15% by weight of an additive. Additives of the invention include, but are not limited to at least one of acetonitrile, ethanol, methanol, isopropanol, tetrahydrofuran, methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, dimethyl ethanolamine.

Also preferably, applying the supercritical fluid to the wafer work surface includes passing the supercritical fluid through a process vessel containing the wafer such that a flow field is established over the wafer work surface. Preferably the flow field impinges on the wafer with a flux of between about 100 g/min and 10 kg/min. In a particularly preferred embodiment, the flow field is established over each work surface of a plurality of wafers. Preferably the plurality of wafers is at least about twenty-five wafers (i.e. an industry recognized standard for a cassette of wafers). Preferably at least one of the supercritical fluid and the wafer are agitated while the supercritical fluid is in contact with the wafer work surface. Agitation preferably includes at least one of pulsing the pressure of the supercritical fluid, sonicating, vibrating, stirring, high flow, fluid recirculation, and combinations thereof. In preferred embodiments, applying the supercritical fluid to the wafer work surface is conducted over a period of not more than about 60 minutes, more preferably not more than about 20 minutes, most preferably not more than about 5 minutes.

These and other features and advantages of the present invention will be described in more detail below with reference to the associated drawings.

DETAILED DESCRIPTION OF PREFERRED EMBODIMENTS

Figure 1:
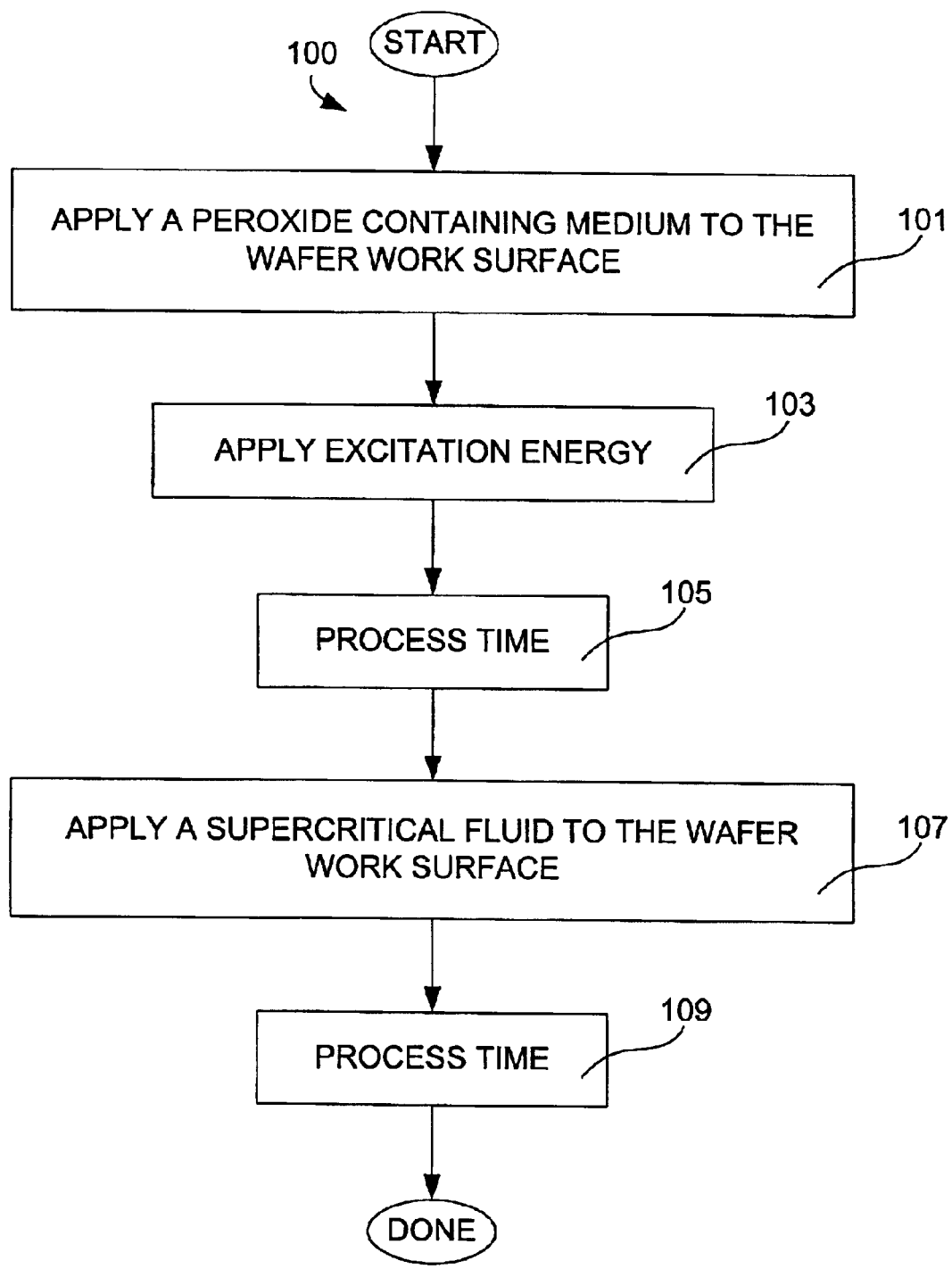
FIG. 1 is a flow chart depicting aspects of a process flow in accordance with the invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In some descriptions herein, well-known processes, procedures, and components have not been described in detail so as not to unnecessarily obscure aspects of the present invention.

In this application, the term "wafer" is used extensively. The term "wafer" generally refers to a semiconductor wafer as such wafer exists during any of many stages of integrated circuit fabrication thereon. The discussion herein focuses on wafer cleaning operations; it is meant that cleaning and removing generally mean the same thing. One skilled in the art would generally refer to "cleaning" contaminants, and "removing" deposited materials. Preferably the invention is used to clean contaminants (e.g. polymer residue) and/or remove deposited materials (e.g. photoresist) from wafers.

Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the temperature and pressure of a solution are both greater than 80% of their critical point, but the solution is not yet in the supercritical phase. Due to their unique properties, supercritical fluids are useful for a wide variety of processes. Of particular interest is the extremely low surface tension making the supercritical fluid ideal for work involving very small features. In this application, when a fluid, solvent, or other solution is referred to as "supercritical" it is understood to describe both supercritical and near supercritical conditions. In this application, the term "supercritical fluid" refers to the supercritical form of a solvent and optionally one or more solutes. Note that a supercritical fluid may include mixtures of solvents.

As mentioned removal of contaminants, particularly photoresist and post-etch residue, from semiconductor wafers presents a major challenge. The invention provides methods for cleaning wafers that is particularly useful for removing organic, high molecular weight or polymeric materials from wafers. A wafer or wafers is first treated with a peroxide-containing medium, for example, to oxidatively cleave bond structures of contaminants on the wafer work surface. Excitation energy is used to activate the peroxide-containing medium toward the formation of radical species. This first treatment (peroxide-containing medium combined with excitation energy) is used to break up and remove (with agitation and/or flow of the medium over the wafer surface and/or a rinse step) a majority of the contaminant or contaminants on the wafer. After treatment with the peroxide-containing medium, a supercritical fluid treatment is used to remove any remaining contaminants as well as condition the wafer for subsequent processing.

The invention provides superior removal of contaminants from wafers, especially organic polymeric materials. The invention achieves this result by separate application of an activated peroxide medium followed by a supercritical fluid treatment Although the steps could be combined, by keeping them separate, the invention increases the efficiency of the overall process. First, by keeping peroxide-containing medium separate from the supercritical fluid, a much more concentrated (than would be possible in, for example, supercritical $CO_2$) peroxide-containing medium is realized. Second, a separate supercritical fluid application is more effective (than one combined with a peroxide-containing medium) at removing any remaining peroxide-containing medium, contaminants, or rinse solvents from the surface and small features. The supercritical fluid can also serve as a drying agent which extracts moisture from the small features or porous underlayers without causing the surface tension related damage often seen in traditional drying processes.

FIG. 1 describes aspects of a method, 100, for cleaning a wafer in accordance with the invention. First a peroxide-containing medium is applied to the wafer work surface. See 101. The peroxide-containing medium is preferably a liquid of relatively low surface tension so that it penetrates small (<1 $\mu$m) features on the wafer work surface, particularly trench and via structures, although capillary action may serve to alleviate this need. For example water, a preferred component of the peroxide-containing medium, has a fairly high surface tension. The peroxide-containing medium can also be a viscous liquid, a gel, or the like. As mentioned, preferably the peroxide-containing medium includes at least one of an aqueous solution, an organic solution, and a solution containing both water and an organic solvent. One particularly preferred peroxide-containing medium is aqueous hydrogen peroxide.

Preferably the peroxide-containing medium includes between about 10% and 70% by weight of a peroxide source, more preferably between about 30% and 50% by weight of a peroxide source. In preferred embodiments, the peroxide source includes at least one of an inorganic peroxide and an organic peroxide. Inorganic peroxides preferably include at least one of hydrogen peroxide and peroxide adducts such as urea hydroperoxides, ammonium persulfate, and sodium percarbonate. Organic peroxides of the invention include at least one of a monoalkyl peroxide, a dialkyl peroxide, a monoacyl peroxide, and a diacyl peroxide. Specific examples of such organic peroxides include at least one of tertiary-butyl hydrogen peroxide, meta-chloroperbenzoic acid, benzoyl peroxide, di-tertiary butyl peroxide, dicumyl peroxide, acetyl peroxide, benzyl peroxide, and butanone peroxide.

When organic peroxides are used, an organic solvent may be used alone in the peroxide-containing medium, however, preferably an organic solvent is used to dissolve the organic peroxide into an aqueous solution, that is, the peroxide-containing medium is a homogeneous solution containing both water and a water-soluble organic solvent. However, heterogenous peroxide-containing mediums (including bi-phasic mixtures) are also within the scope of the invention. Preferably the organic solvent includes at least one of an ether, an alcohol, an alkyl halide, a ketone, a nitrile, an aliphatic solvent, an aromatic solvent, an amide, an ester, and an acid. Preferred organic solvents include but are not limited to acetonitrile, ethanol, methanol, isopropanol, tetrahydrofuran, methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, dimethyl ethanolamine.

In some cases it is desirable to include a radical initiator in the peroxide-containing medium. Preferably the radical initiator includes at least one of 2,2'-azo-bis-isobutyrlnitrile, benzoyl or dicumyl peroxide. Additionally, ozone may be added to enhance radical generation. The enhanced oxidative power and cleaning efficiency of cleaning methods using ozone is described in U.S. patent application Ser. No. 10/128,899 filed Apr. 22, 2002, and titled "Method and Apparatus for Removing Photoresist and Post-Etch Residue From Semiconductor Substrates By In-Situ Generation of Oxidizing Species", naming Tipton, et al. as the inventors, which is incorporated herein by reference for all purposes.

Also as mentioned, the pH of the peroxide-containing medium is important. If basic, preferably the pH of the peroxide-containing medium is between about 9 and 12. If acidic, preferably the pH of the peroxide-containing medium is between about 1 and 6. For each particular application, the pH of the peroxide-containing medium is adjusted to drive the equilibrium toward the breakdown of peroxide radicals thus maximizing bond cleaving potential.

The peroxide-containing medium is applied to the wafer work surface and also an excitation energy is applied to the peroxide-containing medium while the peroxide-containing medium is in contact with the wafer work surface. See 103. One skilled in the art would understand that the order of blocks 101 and 103 can be reversed. That is, for example, the excitation energy may be applied to the wafer work surface, and then the peroxide-containing medium applied to the wafer work surface. In that way, the excitation energy is by default applied to the peroxide-containing medium. The excitation energy applied is sufficient to generate corresponding hydroxy and peroxy radicals from interaction with the peroxide-containing medium. The excitation energy creates an activated peroxide-containing medium, that is, radical formation and reaction kinetics are enhanced. Preferably applying the excitation energy includes exposing the peroxide-containing medium to at least one of a heat source, an irradiation source, and a mechanical agitation source.

Irradiation sources of the invention preferably include at least one of a UV lamp, a mercury arc lamp, an eximer laser, a xenon flash lamp, and a high intensity discharge lamp. In one particularly preferred embodiment, applying the excitation energy includes exposing the peroxide-containing medium to ultraviolet radiation having a wavelength of between about 150 nm and 500 nm, more preferably between about 150 nm and 200 nm.

Heat sources of the invention preferably include at least one of a wafer stage heater an infrared heater lamp source, a process vessel with heated interior surfaces, and a recirculating heater or heat exchange coils immersed in the processing fluid. In such embodiments, preferably applying the excitation energy includes heating the peroxide-containing medium to between about 40° C. and 150° C.

Preferably the mechanical agitation sources of the invention include at least one of a transducer element (capable of generating mechanical vibration to the wafer, and a probe member to transmit said mechanical vibration to the wafer), a rotation mechanism, an orbit mechanism, and the like.

For the transducer elements of the invention, preferably the source of such vibration may operate in either the ultrasonic or megasonic spectrum. The ultrasonic spectrum would be characterized by frequencies in the range between 10 kHz and 40 kHz, while the megasonic spectrum would consist of frequencies in the range between 100 kHz and 1 MHz. Preferably this energy is transmitted to the wafer via the liquid peroxide-containing medium. The sonic energy provides at least four advantageous effects: a) by exciting the various elements of resist and residue it enhances penetration of the peroxide-containing solution into the pores of the resist and residue which are to be removed, b) by reducing any boundary layer caused by flow of the peroxide-containing medium over the wafer surface, the sonic energy enhances the mass transport of active peroxide to the reaction sites at the wafer, and c) by providing pulsating flow the sonic energy enhances the transport of reactants into and products of reaction out of the various features such as vias and trenches that have been etched on the wafer, and d) the sonic energy can break up the reacted material and detach it from the wafer surface.

Preferably the mechanical agitation includes motion sufficient to remove spent reagent from the wafer surface. As well, such motion may serve to position the wafer such that the entire work surface area is under the influence of the excitation energy sources. An example of such motion is rotation or orbiting about an axis perpendicular to the work surface of the wafer. Orbiting motion contains both a rotational and a translational element. Preferred speeds of rotation (whether orbiting or not) during exposure to either the peroxide-containing medium or the supercritical fluid preferably are between about 2 rpm and 200 rpm, more preferably between about 10 rpm and 50 rpm. During any subsequent drying processes, for example to remove liquid reagent from the wafer surface after all resist has been stripped, preferably the rotation speeds are between about 100 rpm and 5000 rpm, more preferably between about 1000 rpm and 3000 rpm.

Mechanical motion of the wafer via movement of the stage upon which it is supported during processing can provide two benefits: removal of spent reagent and the products of the resist-stripping reaction, and the subjecting of all areas of the wafer to the effects of the various other sources of excitation. Rotation or orbiting of the wafer stage is effected by either a servo-motor or stepper motor equipped with the appropriate electronic control mechanism necessary to control speed.

Again, one skilled in the art would understand that any individual excitation energy application can include any or all of the above mentioned energy sources. Heating and agitation are also used to facilitate break up and removal of solid residues. Additionally, the wafer may be rotated, orbited, or otherwise moved to facilitate removal and exchange rate of fresh peroxide-containing medium with used peroxide-containing medium. The peroxide-containing medium can be flowed over the work surface of the wafer via flow jets and the like.

Referring again to FIG. 1, next a process time is applied, that is, while the wafer work surface is in contact with the activated peroxide-containing medium and the excitation energy. See 105. The time sum of blocks 101–105 is minimized to provide greater wafer throughput. Preferably applying the peroxide-containing medium to the wafer work surface and applying the excitation energy to the peroxide-containing medium, while the peroxide-containing medium is in contact with the wafer work surface (i.e. process time) are conducted over a period of not more than about 60 minutes, more preferably not more than about 10 minutes, most preferably not more than about 2 minutes.

Prior to application of the supercritical fluid to the wafer work surface, methods of the invention can optionally include rinsing the wafer work surface with a solvent. Deionized water is a particularly preferred solvent for this purpose, although other solvents, for example organic solvents (or mixtures of water and organic solvents, or mixtures of only organic solvents) as listed above, can be used for rinsing the wafer. When aqueous and/or aqueous soluble peroxide-containing media are used for blocks 101–105, DI water is particularly useful as a rinse solvent For example, if a wafer is treated with a solution of an organic peroxide in acetonitrile (a water miscible organic solvent), then DI water would be a particularly useful rinse solvent. In the latter case, preferably acetonitrile is used to rinse away the peroxide-containing medium (and any organic soluble contaminants) and then water is used to remove any remaining acetonitrile and any remaining water-soluble contaminants. Alternatively, a mixture of acetonitrile and water can be used as a rinse solvent. Other water-soluble organic solvents (and mixtures thereof) listed above can be used in a similar fashion.

In some embodiments a rinse step is not needed. Supercritical fluids have good solvating properties. Therefore in some embodiments, for example when the methods are performed in a single processing chamber, the supercritical fluid application is sufficient to remove the peroxide-containing medium, any contaminants therein, and any remaining contaminants on the wafer work surface.

After application of the peroxide-containing medium (or after an optional rinse), a supercritical fluid is applied to the wafer work surface. See 107. Preferably applying the supercritical fluid to the wafer work surface is performed at a pressure of between about 1200 and 5000 psi, and at a temperature of between about 20° C. and 150° C. Preferred supercritical fluids of the invention include at least one of carbon dioxide, ammonia, water, ethane, propane, butane, dimethyl ether, hexafluoroethane, $SF_6$, ethylene, $N_2O$, Xe, and mixtures thereof In particularly preferred embodiments, the supercritical fluid also contains between about 0 and 15% by weight of an additive. Additives of the invention include, but are not limited to at least one of acetonitrile, ethanol, methanol, isopropanol, tetrahydrofuran, methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, dimethyl ethanolamine. A description of preferred additives for supercritical fluid processing of wafers is described in U.S. patent application Ser. No. 10/125,614 entitled, "Additives for Cleaning Silicon Wafers with Supercritical $CO_2$," naming Reinhardt et al. as inventors, which was filed on Apr. 18, 2002, which is herein incorporated by reference for all purposes.

Also preferably, applying the supercritical fluid to the wafer work surface includes passing the supercritical fluid through a process vessel containing the wafer such that a flow field is established over the wafer work surface. In a particularly preferred embodiment, the flow field is established over each work surface of a plurality of wafers. Preferably the plurality of wafers is at least about twenty-five wafers (an industry-recognized standard for a cassette of wafers). Preferably the flow field impinges on the wafer work surface (or the work surface of each of the plurality of wafers) with a flux of between about 100 g/min and 10 kg/min.

Preferably at least one of the supercritical fluid and the wafer are agitated while the supercritical fluid is in contact with the wafer work surface. Agitation preferably includes at least one of pulsing the pressure of the supercritical fluid, sonication, vibration, stirring, high flow volume, fluid recirculation, and the like. A description of preferred pulsing parameters for supercritical fluids is described in U.S. patent application Ser. No. 10/067,520 entitled, "Apparatus and Methods for Processing Semiconductor Substrates Using Supercritical Fluids," naming Shrinivasan et al. as inventors, which was filed on Feb. 5, 2002, which is herein incorporated by reference for all purposes. For an example of vibration, a wafer stage or holder in a supercritical fluid processing apparatus may have a vibrator or sonication source in it.

Application of the supercritical fluid (with any of the above described agitation methods) is performed for a defined process time. See 109. In preferred embodiments, applying the supercritical fluid to the wafer work surface is conducted over a period of not more than about 60 minutes, more preferably not more than about 20 minutes, most preferably not more than about 5 minutes. After the process time, the method is done.

Figure 2:
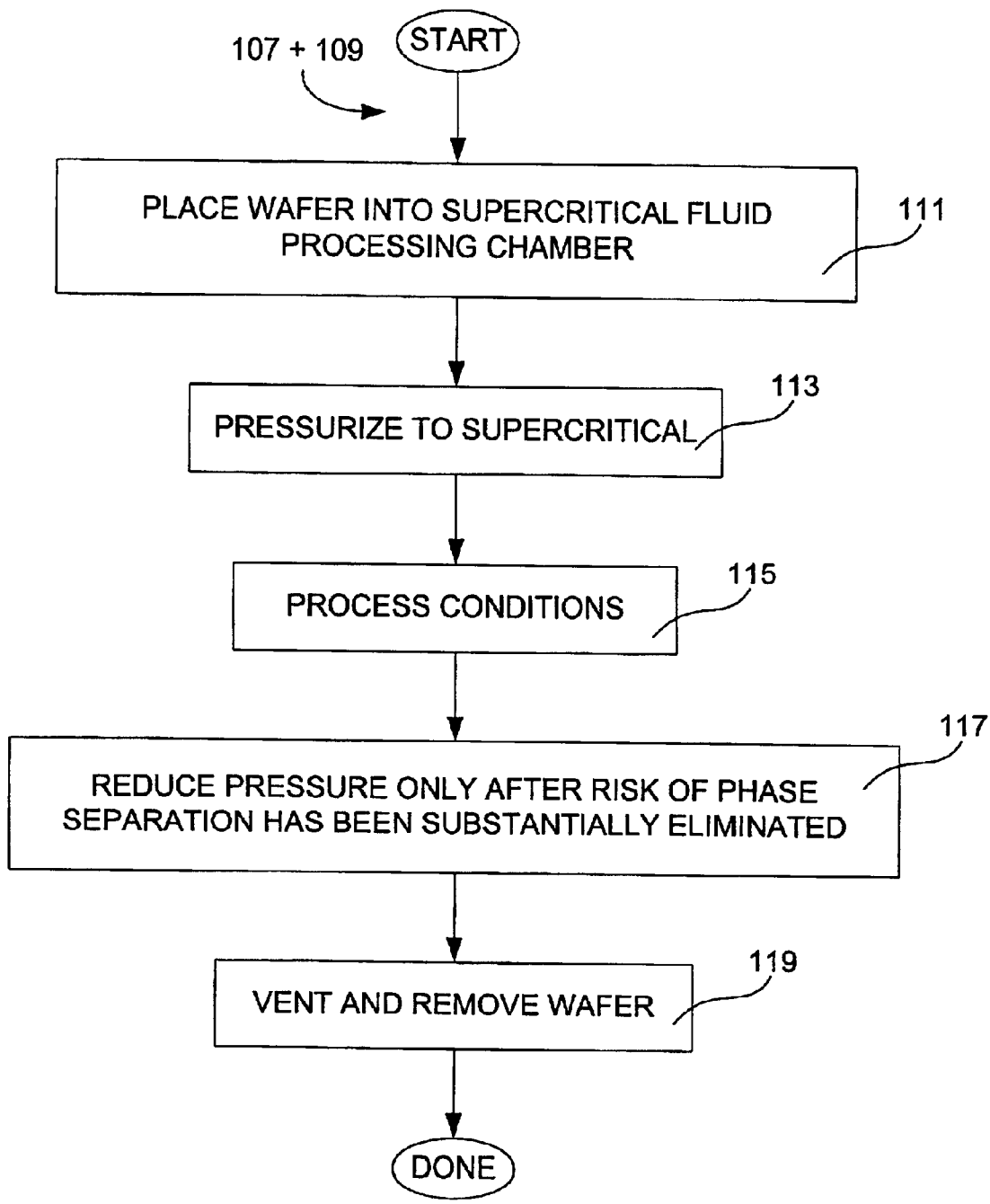
FIG. 2 is a flow chart depicting aspects of a process flow for applying a supercritical fluid to a wafer in accordance with the invention.

FIG. 2 is a flowchart describing an exemplary embodiment of blocks 107 and 109 of the flowchart in FIG. 1. In this example, applying the supercritical medium to the wafer work surface begins with placing the wafer (or wafers) into a supercritical processing chamber. See 111. Next, the chamber is brought to supercritical pressure with a solvent. See 113. In the case that an additive is used with the supercritical fluid, the additive can be added before or after supercritical conditions are reached. A description of preferred methods and apparatus for addition of additives directly to supercritical fluids is described in U.S. patent application Ser. No. 10/016,017 entitled, "Method and Apparatus for Introduction of Solid Precursors and Reactants into a Supercritical Fluid Reactor," naming Gopinath et al. as inventors, which was filed on Dec. 12, 2001, which is herein incorporated by reference for all purposes.

After supercritical conditions are achieved, process conditions are applied. See 115. Process conditions include the above-mentioned time, pulsing, agitation, flow parameters, and the like. Preferably the process conditions include exchange of the supercritical fluid, for example via recirculation or a flow-through process to remove contaminants. Additionally, the application of the supercritical fluid is used to condition the wafer for subsequent processing. For example, if a wafer is processed with water (e.g., an aqueous peroxide-containing medium and/or a water rinse step), then the supercritical fluid is used to remove substantially all traces of water from the wafer so that it is ready for any subsequent process that requires that it be dry.

The supercritical process may also be used to remove trace amounts of contamination not removed by the peroxide process. For example, as feature sizes are reduced, penetration of the peroxide-containing solution in the prior step may no longer be feasible. Therefore, contaminants on the sidewalls and the bottom of these features may not be removed by the prior step of processing using the peroxide-containing solution. The supercritical process overcomes this limitation because of very low or non-existent surface tension. Moreover, penetration of undesirable solvents into the pores of a porous dielectric material during the peroxide process can be reversed by application of the supercritical fluid to extract such solvents.

After the process conditions, the pressure in the process chamber is reduced preferably after the risk of phase separation of one or more solutes from the supercritical fluid has been substantially eliminated. See 117. For example, in some instances a solute additive (or contaminant) may precipitate from the supercritical fluid once the pressure is reduced (although the pressure may still be within a supercritical range). In this case, the supercritical fluid is diluted (while under supercritical conditions) to reduce the risk of such a phase separation. A description of preferred methods and apparatus for diluting supercritical fluids is described in U.S. patent application Ser. No. 10/067,520 which was incorporated by reference above. In another example, the bulk of the additives (or contaminants) are removed prior to depressurization. A description of preferred methods for removal of solutes from supercritical fluids is described in U.S. patent application Ser. No. 10/099,555 entitled, "Method and Apparatus to Remove Additives and Contaminants from a Supercritical Processing Solution," naming Humayun et al. as inventors, which was filed on Mar. 13, 2002, which is herein incorporated by reference for all purposes.

After the risk of such a phase separation has passed, and the pressure reduced, the process vessel is vented and the wafer removed See 119. Then the method is done.

EXPERIMENTAL

The following is a general description of an exemplary cleaning method of the invention.

A solution of 10 ml of 50% aqueous hydrogen peroxide was added to a teflon dish (2 inches in diameter, 0.5 inches deep) containing a 1 in. by 1 in. dual damascene coral wafer substrate with 300 nm thick resist and 100 nm thick crust The solution was irradiated with an eximer lamp (wavelength 193 nm) for 90 minutes.

The wafer substrate was removed from the solution and transferred to a supercritical fluid extractor. The wafer substrate was processed with supercritical $CO_2$ (200 bar, 70° C.) for 15 min at 50 g/min.

Figure 3:
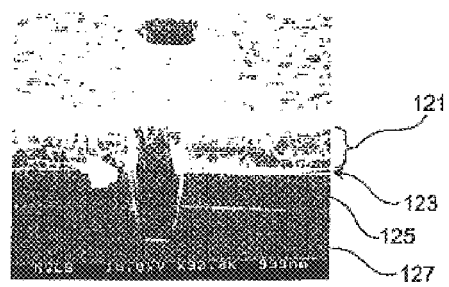
FIGS. 3 and 4 depict SEM (scanning electron microscopy) images of a wafer substrate before and after exposure to cleaning methods of the invention.
Figure 4:
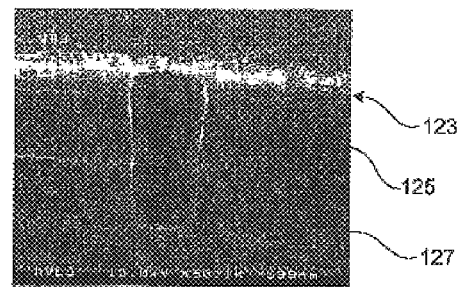

FIG. 3 shows SEM data of the substrate before the experiment. Resist and crust, layer 121, are atop the desired $SiO_2$ layer 123 and dielectric layers 127 and 127 (some intermediary and lower layers not referenced). FIG. 4 shows SEM data after the cleaning method described. As can be seen, resist and crust 121 are effectively removed, leaving $SiO_2$ layer 123 as the topmost layer with no visible resist or crust residues.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of cleaning a wafer work surface having organic residue, the method comprising:
   (a) applying a peroxide-containing medium to the wafer work surface;
   (b) applying an excitation energy to the peroxide-containing medium while the peroxide-containing medium is in contact with the wafer work surge, said excitation energy sufficient to generate corresponding peroxide radicals from interaction with the peroxide-containing medium; and then
   (c) applying a supercritical fluid to the wafer work surface, wherein the supercritical fluid is free from the peroxide-containing medium.

2. The method of claim 1, wherein the peroxide-containing medium comprises at least one of an aqueous solution, an organic solution, and a solution containing both water and an organic solvent.

3. The method of claim 2, wherein the peroxide-containing medium comprises between about 10% and 70% by weight of a peroxide source.

4. The method of claim 2, wherein the peroxide-containing medium comprises between about 30% and 50% by weight of a peroxide source.

5. The method of claim 3, wherein the peroxide-containing medium further comprises ozone.

6. The method of claim 3, wherein the peroxide source comprises at least one of an inorganic peroxide and an organic peroxide.

7. The method of clam 6, wherein the inorganic peroxide comprises at least one of hydrogen peroxide and a peroxide adduct.

8. The method of claim 3, wherein the peroxide-containing medium comprises a radical initiator.

9. The method of claim 8, wherein the radical initiator comprises at least one of 2,2'-azo-bis-isobutyrlnitrile, dicumyl peroxide, and benzoyl peroxide.

10. The method of claim 1, wherein applying a peroxide-containing medium to the wafer work surface and applying an excitation energy to the peroxide-containing medium while the peroxide-containing medium is in contact with the wafer work surface are conducted over a period of not more than about 60 minutes.

11. The method of claim 1, wherein applying a peroxide-containing medium to the wafer work surface and applying an excitation energy to the peroxide-containing medium while the peroxide-containing medium is in contact with the wafer work surface are conducted over a period of not more than about 10 minutes.

12. The method of claim 1, wherein applying a peroxide-containing medium to the wafer work surface and applying an excitation energy to the peroxide-containing medium while the peroxide-containing medium is in contact with the wafer work surface are conducted over a period of not more than about 2 minutes.

13. The method of claim 3, wherein the peroxide-containing medium is acidic.

14. The method of claim 13, wherein the pH of the peroxide-containing medium is between about 1 and 6.

15. The method of claim 1, wherein applying the excitation energy comprises exposing the peroxide-containing medium to at least one of a heat source, an irradiation source, and a mechanical agitation source.

16. The method of claim 15, wherein the irradiation source comprises at least one of a UV lamp, a mercury arc lamp, an eximer laser, a xenon flash lamp, and a high intensity discharge lamp.

17. The method of claim 1, wherein applying the excitation energy comprises exposing the peroxide-containing medium to ultraviolet radiation with a wavelength of between about 100 and 500 nm.

18. The method of claim 1, wherein applying the excitation energy comprises exposing the peroxide-containing medium to ultraviolet radiation with a wavelength of between about 150 nm and 200 nm.

19. The method of claim 1, further comprising rinsing the wafer work surface with a solvent before applying the supercritical fluid to the wafer work surface.

20. The method of claim 19, wherein the solvent is deionized water.

21. The method of claim 1, wherein the supercritical fluid comprises at least one of carbon dioxide, ammonia, water, ethane, propane, butane, dimethyl ether, hexafluoroethane, dimethyl ether, $SF_6$, ethylene, $N_2O$, Xe, and mixtures thereof.

22. The method of claim 21, wherein the supercritical fluid further comprises between about 0 and 15% by weight of an additive.

23. The method of claim 22, wherein the additive comprises at least one of acetonitrile, ethanol, methanol, isopropanol, tetrahydrofuran methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, dimethyl ethanolamine.

24. The method of claim 1, wherein applying the supercritical fluid to the wafer work surface is performed at a pressure of between about 1200 and 5000 psi.

25. The method of claim 1, wherein applying the supercritical fluid to the wafer work surface is performed at between about 20° C. and 150° C.

26. The method of claim 1, wherein applying the supercritical fluid to the wafer work surface is conducted over a period of not more than about 60 minutes.

27. The method of claim 1, wherein applying the supercritical fluid to the wafer work surface is conducted over a period of not more than about 20 minutes.

28. The method of claim 1, wherein applying the supercritical fluid to the wafer work surface is conducted over a period of not more than about 5 minutes.

29. The method of claim 1, wherein applying the supercritical fluid to the wafer work surface comprises passing the supercritical fluid through a process vessel containing the wafer such that a flow field is established over the wafer work surface.

30. The method of claim 29, wherein the process vessel holds a plurality of wafers, and the flow field is established over the work surfaces of each of the plurality of wafers.

31. The method of claim 30, wherein the plurality of wafers comprises at least about twenty-five wafers.

32. The method of claim 29, wherein the flow field impinges on the wafer with a flux of between about 100 g/min and 10 kg/min.

33. The method of claim 21, further comprising agitating at least one of the supercritical fluid and the wafer while the supercritical fluid is in contact with the wafer work surface.

34. The method of claim 33, wherein agitating at least one of the supercritical fluid and the wafer comprises pulsing the pressure of the supercritical fluid, sonication, vibration, manipulation of fluid flow, and combinations thereof.

35. The method of claim 7, wherein the peroxide adduct comprises at least one of a urea hydroperoxide adduct an ammonium persulfate adduct, and a percarbonate adduct.

36. The method of claim 6, wherein the organic peroxide comprises at least one of a monoalkyl peroxide, a dialkyl peroxide, a monoacyl peroxide, and a diacyl peroxide.

37. The method of claim 36, wherein the organic peroxide comprises at least one of tertiary butyl hydrogen peroxide, meta-chloroperbenzoic acid, benzoyl peroxide, di-tertiary butyl peroxide, dicumyl peroxide, acetyl peroxide, benzyl peroxide, and butanone peroxide.

38. The method of claim 2, wherein the organic solvent comprises at least one of an ether, an alcohol, an alkyl halide, a ketone, a nitrile, an aliphatic solvent, an aromatic solvent, an amide, an ester, an acid, an amine, and a fluorinated alkane.

39. The method of claim 38, wherein the organic solvent comprises at least one of acetonitrile, ethanol, methanol, isopropanol, tetrahydrofuran, methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, dimethyl ethanolamine, and, hexafluoroethane.

40. The method of claim 3, wherein the peroxide-containing medium is basic.

41. The method of claim 40, wherein the pH of the peroxide-containing medium is between about 9 and 12.

42. The method of claim 15, wherein the heat source comprises at least one of a wafer stage heater an infrared heater lamp source, a process vessel with heated interior surfaces, a recirculating heater, and heat exchange coils immersed in the processing fluid.

43. The method of claim 15, wherein the mechanical agitation source comprises a transducer element capable of generating mechanical vibration and a probe member configured to transmit said mechanical vibration to the wafer.

44. The method of claim 15, wherein applying the excitation energy comprises heating the peroxide-containing medium to between about 40° C. and 150° C.

45. The method of claim 24, wherein the pressure is pulsed.

46. A method of cleaning a wafer work surface, the method comprising:
  (a) applying a peroxide-containing medium to the wafer work surface;
  (b) applying an irradiation source to impart an excitation energy to the peroxide-containing medium while the peroxide-containing medium is in contact with the wafer work surface, said excitation energy sufficient to generate corresponding peroxide radicals from interaction with the peroxide-containing medium; and then
  (c) applying a supercritical fluid to the wafer work surface wherein the supercritical fluid does not include the peroxide containing medium.

* * * * *